United States Patent
Hengerer et al.

(10) Patent No.: US 10,180,469 B2
(45) Date of Patent: Jan. 15, 2019

(54) GESTURE-CONTROLLED MR IMAGING SYSTEM AND METHOD

(71) Applicants: Siemens Healthcare GmbH, Erlangen (DE); Johns Hopkins University, Baltimore, MD (US)

(72) Inventors: Arne Hengerer, Möhrendorf (DE); Eva Rothgang, Nürnberg (DE); Lars Lauer, Neunkirchen (DE); Jonathan Lewin, Baltimore, MD (US); Wesley David Gilson, Northbeach, MD (US); Jan Fritz, Baltimore, MD (US); Clifford R. Weiss, Baltimore, MD (US); Katarzyna J. Macura, Baltimore, MD (US); Paul A. Bottomley, Baltimore, MD (US)

(73) Assignees: Siemens Healthcare GmbH, Erlangen (DE); The John Hopkins University, Baltimore, MD (US)

(*) Notice: Subject to any disclaimer, the term of this patent is extended or adjusted under 35 U.S.C. 154(b) by 489 days.

(21) Appl. No.: 14/924,843

(22) Filed: Oct. 28, 2015

(65) Prior Publication Data

US 2017/0123030 A1    May 4, 2017

(51) Int. Cl.
| | |
|---|---|
| G01R 33/54 | (2006.01) |
| G06K 9/00 | (2006.01) |
| G01R 33/28 | (2006.01) |
| G06F 3/01 | (2006.01) |

(52) U.S. Cl.
CPC ......... *G01R 33/283* (2013.01); *G01R 33/546* (2013.01); *G06F 3/017* (2013.01); *G06K 9/00355* (2013.01)

(58) Field of Classification Search
None
See application file for complete search history.

(56) References Cited

U.S. PATENT DOCUMENTS

| | | | |
|---|---|---|---|
| 8,745,541 B2 | 6/2014 | Wilson et al. | |
| 2014/0049465 A1* | 2/2014 | Tremaine | G06F 3/017 345/156 |
| 2014/0350381 A1* | 11/2014 | Kim | A61B 5/4848 600/411 |
| 2016/0047872 A1* | 2/2016 | Park | A61B 5/055 324/309 |

(Continued)

OTHER PUBLICATIONS

Gallo et al, Controller-free exploration of medical image data: experiencing the Kinect, Jun. 2011, IEEE.*

(Continued)

*Primary Examiner* — Jermele M Hollington (57) ABSTRACT

A magnetic resonance imaging system and method are provided that include user control of certain functions using physical gestures, such as hand motions or the like. The gesture control aspects can include one or more cameras, and a processor configured to detect and recognize gestures corresponding to predetermined commands and to provide signals to execute the commands. A verification switch, such as a foot switch, can be included to improve safety and reliability of the gesture control aspects. This switch can be used to activate the gesture detection aspects and/or to confirm a recognized gesture command prior to its execution.

20 Claims, 4 Drawing Sheets

(56) References Cited

U.S. PATENT DOCUMENTS

2016/0140726 A1* 5/2016 Jo .......................... G06T 7/11
  382/131
2016/0370870 A1* 12/2016 Hengerer ............... G06F 3/017

OTHER PUBLICATIONS

Wachs et al, A Gesture-based Tool for Sterile Browsing of Radiology Images, May 2008, Journal of the AMerican Medical Informatics Assoc.*

* cited by examiner

GESTURE-CONTROLLED MR IMAGING SYSTEM AND METHOD

FIELD OF THE DISCLOSURE

The present disclosure relates to a method and a system for generating magnetic resonance images, and in particular to a method and a system for generating magnetic resonance images that includes hands-free gesture control by an operator for certain functions of a magnetic resonance imaging device.

BACKGROUND INFORMATION

Magnetic resonance (MR) imaging is a known technology that can produce images of the inside of an examination subject without radiation exposure. In a typical MR imaging procedure, the subject is positioned in a strong, static, homogeneous base magnetic field B0 (having a field strength that is typically between about 0.5 Tesla and 3 Tesla) in an MR apparatus, so that the subject's nuclear spins become oriented along the base magnetic field. Radio-frequency (RF) excitation pulses are directed into the examination subject to excite nuclear magnetic resonances, and subsequent relaxation of the excited nuclear magnetic resonances can generate RF signals. Rapidly switched magnetic gradient fields can be superimposed on the base magnetic field, in various orientations, to provide spatial coding of the RF signal data. The RF signal data can be detected and used to reconstruct images of the examination subject. For example, the acquired RF signal data are typically digitized and stored as complex numerical values in a k-space matrix. An associated MR image can be reconstructed from the k-space matrix populated with such values using a multi-dimensional Fourier transformation.

Magnetic resonance imaging (MRI) can be used in certain interactive procedures, such as precise real-time MR-guided needle placement (e.g. for tissue biopsy sampling, infiltration, precise placement of a thermal applicator such as a radio frequency (RF) needle or the like, etc.). In such MRI-guided (or MRI-assisted) procedures, it may be essential to control the MRI system from within the scanner room. Typically, the commands needed for such interactive MRI control during a procedure can be a limited of commands that may be applied several times during a procedure. For example, in some MRI-assisted needle placement procedures, a dynamic control of the imaging plane for monitoring of the needle trajectory in real time can be used. This monitoring can be achieved by updating or varying the imaging plane between image acquisitions based on the position and/or orientation of the needle. Additional commands may be desirable during such procedures, e.g., to control movement of the patient table movement or for control of a robotic device.

The usage of conventional control interfaces such as e.g., a keyboard, a computer mouse, etc. for the control of the MRI scanner and associated devices can be cumbersome during a procedure. Further, the presence and use of such interface devices may impact sterility of the room in which the MRI-assisted procedure is being performed. Operation of such conventional computer interfaces by the interventionist may also be incompatible with workflow requirements and/or may raise safety concerns during procedures, as they typically require the interventionist to be within reach of a mouse/keyboard. Manual operation of a keyboard or mouse can also be inconvenient in certain procedures, e.g., if the interventionist wishes to control aspects of the MRI scanner and/or display while holding one or more instruments.

In conventional MRI-assisted procedures, the interventionist may verbally instruct a technician in the console room to control aspects of the imaging system during. Because MRI systems are typically very loud, such communication may be supported by a communication system that includes special noise-cancelling headphones and microphones. Alternatively the interventionist can provide operational instructions by making gestures towards the technician to indicate what action is to be taken. However, such signaling approach requires an understanding between the interventionist and the technician of the meaning of any gestures, and proper interpretation of such signals, which may be distracting to the interventionist. The reliability of such visual communication of commands can also be inconsistent if different technicians work with different interventionists.

Additionally, activating certain commands during MRI-assisted procedures may be undesirable or raise safety concerns. For example, moving the patient table while a needle is inserted can be dangerous and/or impair the effectiveness of an insertion procedure. During such procedures, improved control and verification of system commands by an interventionist may be desirable.

Accordingly, it would be desirable to have a system and method for controlling aspects of an MRI system during interactive imaging procedures that addresses some of the shortcomings described above.

SUMMARY OF EXEMPLARY EMBODIMENTS

Exemplary embodiments of the present disclosure can provide a magnetic resonance (MR) imaging system that includes user control of certain functions using physical gestures, such as hand motions or the like. The system can include various components of a conventional MR system including, e.g., a primary magnet configured to generate a strong base magnetic field B0 (e.g. between 0.2 Tesla and 7 Tesla), a pulse generation unit, pulse sequence control unit, a radio-frequency amplifier, and one or more RF coils or antennas, such as a body coil, that are further configured to emit RF excitation pulses to excite nuclear spins and receive RF signals based on the relaxation of such excited spins. The MR system can further include magnetic gradient coils configured to generate transient gradient magnetic fields superimposed on the static base magnetic field B0. The system can be configures such that RF pulses and magnetic field gradients can be synchronized in various ways to provide spatially selective excitation and spatial encoding of RF signals.

The MR system can further include an image processing unit configured to generate one or more images based on the RF signals that represent image data, a processor arrangement configured to control various components of the MR system, e.g., based on programmed instructions, and one or more display monitors or screens that can display certain functions or parameters of the system, and/or certain images generated by the system.

Embodiment s of the disclosure can also include a gesture control unit, which may include one or more cameras such as digital video cameras, infrared (IR) sensors, still-image cameras, or the like. Each camera can be directed toward one or more motion capture regions. In certain embodiments, the cameras can be configured such that a focal length of each camera corresponds approximately to a predetermined distance between the camera and one or more motion capture regions, which can improve detection accuracy and imaging of objects within the motion capture region. In further embodiments, one or more cameras can be directed toward the general area in which a user of the system may be located, e.g., during an MRI-assisted procedure, to detect movements of the user.

The gesture control unit can also include a gesture processor provided in communication with the cameras and with other components of the imaging system. The gesture processor can include, e.g., a computer processor, memory, a communications bus, instructions stored in computer-readable memory or other media, and the like. It can be configured to receive image data (e.g. motion of a user or object) from the cameras and interpret the image data, subject to certain conditions and/or restrictions, to facilitate identification of predetermined gestures or sequences thereof performed by a user. For example, the gesture control unit can be configured to detect motion, determine whether such motion corresponds to one or more predetermined gestures, and to send signals to other parts of the imaging system to cause commands corresponding to the gestures to be executed.

In certain embodiments, the image processing unit and/or the processor arrangement associated with the MRI system can be configured to receive signals from the cameras and to perform some or all of these gesture recognition functions.

In further embodiments, one or more of the cameras can be provided outside of a sterile room containing the user, subject, and principle components of the MRI apparatus such as the primary magnet and RF coils. A window or the like can be provided in a wall of the room to facilitate visual access between a camera outside of the room and a user inside the room. In further embodiments, one or more cameras can be provided in the same room as the user, subject, and principal components of the MRI system.

The cameras can be provided in wired or wireless communication with the gesture processor, the processor arrangement, and/or the image processing unit, which can also be provided in communication with other components of the MR imaging system.

In further embodiments, the gesture control unit can include one or more cameras directed toward each of a plurality of motion capture regions. Such configuration can facilitate detection of gestures performed by a plurality of users (e.g. an interventionist and an assistant).

In certain embodiments, the gesture control unit can include an emitter that can be attached to the user, worn by the user, etc. The emitter can be configured to emit certain signals such as, e.g., electromagnetic energy, for example, infrared or near-infrared light or light having another particular wavelength or range(s) of wavelengths. In some embodiments, the emitter can include one or more LEDs and/or other emitting elements. At least one camera can be configured to detect signals from the emitter. In one embodiment, the emitter can include one or more LEDs that emit light in the infrared region, and a camera can be configured to be sensitive to such infrared radiation.

In another embodiment, one or more light-reflective markers or objects can be affixed to a user, and one or more light sources (e.g. an infrared source) can be provided and directed toward the user. For example, such a light source can be provided near one or more cameras. The camera(s) can be configured to detect emitted light that is reflected from the reflective markers and thereby detect motion of the marker caused by movement of the user. Other types of emitting elements and cameras can also be used in further embodiments.

In one embodiment, the emitter can be provided as a bracelet worn around a wrist of the user. In further embodiments, the emitter can be attached to a surgical glove (e.g. on the back of a hand), attached to a sleeve or other clothing item worn by the user, provided on a headband worn by the user, or the like. The emitter can be battery powered to provide restriction-free motion, or alternatively it can be wired to a power source. The emitter can include a plurality of emitting elements such as LEDs or the like, which can be spatially distributed to provide detectable signals that are insensitive to a particular orientation of the emitter. In certain embodiments, two or more emitters can be provided for a single user. In still further embodiments, one or more emitters can be provided for each of two or more users.

The gesture control unit includes one or more verification switches that can be provided within reach of a user during operation of the imaging system. In certain embodiments, the verification switch can be an electrical switch, a pneumatic switch, or a mechanical switch. In one embodiment, the verification switch can be a foot-operated switch. In another embodiment, the verification switch 220 can be an inductive switch that can be activated based on proximity of a part of the user's body. In a further embodiment, the verification switch can be mounted to a tabletop or work surface, such that the user can activate it by pressing or contacting it with an elbow, a forearm, or the like.

In still further embodiments, the verification switch can be provided as a switch affixed to the user's hand such that it can be activated by making a fist, pressing the thumb to a fingertip or the side of the index finger, etc. Other types and configurations of the verification switch whereby it can be easily activated by the user can also be provided in further embodiments of the disclosure.

The exemplary system can be configured to detect and recognize particular gestures made by a user that have been predetermined to correspond to certain commands, and to enact or execute such commands to control aspects of the MRI system. Embodiments of the present disclosure can include an MR imaging system configured to facilitate or provide, for example, initiating an MR image acquisition sequence, moving the patient bed, displaying, updating, and/or changing a particular MR image on the display, etc., based on such gesture-based commands. In further embodiments, the system can use gesture-based commands to facilitate setting or changing the parameters of an imaging sequence including, e.g., adjusting or changing the image plane for an imaging sequence, changing certain RF pulse and/or magnetic field gradient parameters associated with the imaging sequence, stopping an imaging sequence, and the like. The system can be configured to recognize and execute a variety of gesture-based commands that can be used to control various aspects of the imaging system and related components.

The exemplary system can also be configured to control the display of one or more MR images on one or more screens using gesture commands. Such control of displayed images using gestures can include displaying particular images, updating images, scrolling between images, moving images on the screen, changing magnification of displayed images, etc.

In some embodiments, the verification switch can be configured to activate or enable gesture detection, gesture recognition, and/or gesture control of certain features of the imaging system only when the verification switch is activated. In further embodiments, the system can be configured to detect and/or recognize a gesture command only within a short time interval after such activation of the verification switch. The short time interval can be, e.g., less than 30 seconds after switch activation, or less than 15 seconds thereafter. Other time intervals can be used in additional embodiments.

In further embodiments of the disclosure, methods can be provided for gesture-based control of an MR imaging system. Such methods include providing a gesture recognition arrangement in communication with the imaging system, as described herein. In one embodiment, the method includes providing a verification switch, and activating one or more cameras to detect and/or recognize gestures made by a user only while the switch is activated. In a further embodiment, the method can include activating one or more cameras to detect and/or recognize gestures made by a user only during a particular time interval after the switch is activated.

In certain embodiments of the present disclosure, a gesture-based control method can be provided in which, upon detection and recognition of a command gesture, the associated command can be displayed to the user on a monitor or screen. The command can be displayed as, e.g., as a text label, a graphic icon or symbol, or a combination of both text and images. The displayed command can then be executed by activating the verification switch to confirm the command. If the command is not verified within a particular time interval, the gesture can be considered not to be accepted and the image showing the command can optionally be removed from the monitor. Such time interval for verification of a displayed gesture command can be relatively short, e.g., within 30 seconds of when the recognized gesture is displayed on the monitor as a command, or within about 15 seconds of such displaying. This time interval can be preferably long enough to allow for verification of a command by the user using the verification switch. In certain embodiments, the system can be configured to detect and recognize a subsequent gesture, and display a command associated with the subsequent gesture on the monitor if a previously-displayed command is not verified by the user by activating the switch.

In further embodiments, certain features of the system configurations and methods described herein can be combined. For example, the system 1 can be configured to detect and/or interpret a gesture only when the verification switch is activated (and optionally shortly thereafter). A command corresponding to such a recognized gesture can then be displayed on the monitor, and the system can be configured to execute the displayed command only after it is verified by activation of the verification switch by the user.

In further embodiments, a plurality of verification switches can be provided. For example, different verification switches can be provided for use/activation by two or more users. Alternatively, different verification switches can be activated by a single user, e.g., a first verification switch can be provided to "activate" the gesture control unit to detect and interpret a gesture, and a second verification switch can be provided to execute a command corresponding to the gesture when the command is displayed on the monitor as described herein.

In still further embodiments, the imaging system can be configured to ignore certain control activities, such as activation of the verification switch, gestures performed by a user, keyboard input, etc. for particular time intervals. Such time intervals can correspond to, e.g., time intervals during which the patient bed is being moved, an instrument such as a needle, probe, or other instrument or device is being placed or positioned on or within a patient, the imaging system is not in a state suitable for receiving commands, etc. In such embodiments, the imaging system can be configured to perform a check on the status of the system to verify whether a gesture or other control command should be executed.

BRIEF DESCRIPTION OF THE DRAWINGS

Further objects, features and advantages of the present disclosure will become apparent from the following detailed description taken in conjunction with the accompanying figures showing illustrative embodiments, results and/or features of the exemplary embodiments of the present disclosure, in which.

Throughout the drawings, the same reference numerals and characters, unless otherwise stated, are used to denote like features, elements, components, or portions of the illustrated embodiments. Similar features may thus be described by the same reference numerals, which indicate to the skilled reader that exchanges of features between different embodiments can be done unless otherwise explicitly stated. Moreover, while the present disclosure will now be described in detail with reference to the figures, it is done so in connection with the illustrative embodiments and is not limited by the particular embodiments illustrated in the figures. It is intended that changes and modifications can be made to the described embodiments without departing from the true scope and spirit of the present disclosure as defined by the appended claims.

DETAILED DESCRIPTION OF EXEMPLARY EMBODIMENTS

Figure 1:
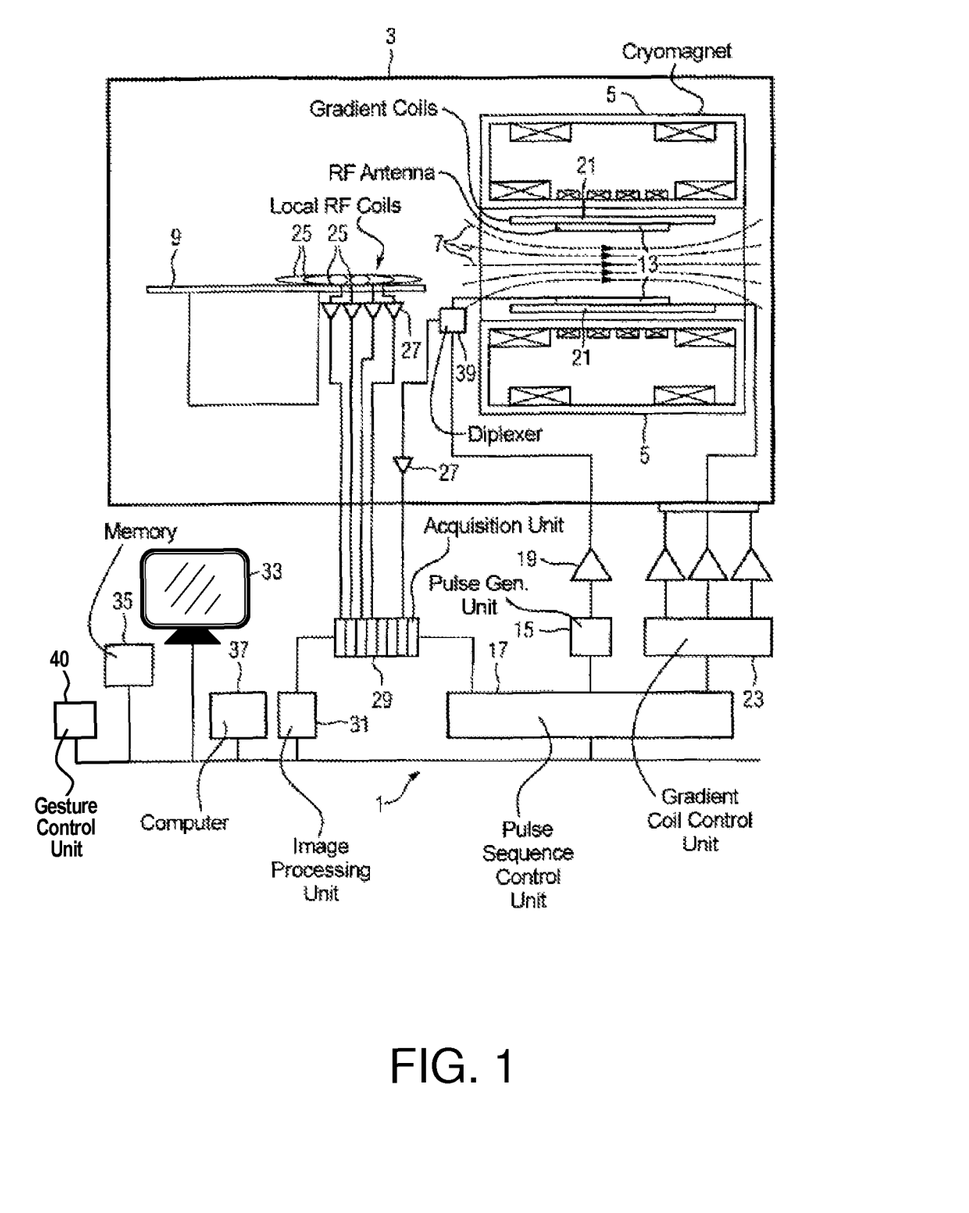
FIG. 1 schematically illustrates the basic components of a magnetic resonance imaging system with gesture-based control of certain functions that is constructed and operating in accordance with embodiments of the present disclosure.

The present disclosure relates to methods and systems for providing improved control of certain system functions by a user during MRI-assisted procedures using gestures, e.g., motions of certain parts of the body. FIG. 1 schematically shows the design of a magnetic resonance system 1 with certain components in accordance with embodiments of the present disclosure. The MR system 1 is configured, inter alia, to provide various magnetic fields tuned to one another as precisely as possible in terms of their temporal and spatial characteristics to facilitate examination of portions of a subject's body using magnetic resonance imaging techniques.

A strong magnet 5 (typically a cryomagnet) is provided in a radio-frequency (RF) shielded measurement chamber 3 to generate a static, strong base magnetic field 7. The magnet 5 can have a tunnel-shaped opening. In some embodiments, the magnet 5 can have an open C-shape with the strong magnetic field generated between the arms of the 'C.' The strength of the base magnetic field 7 is typically between 0.2 Tesla and 3 Tesla, although lower or higher field strengths can be provided in certain embodiments. A body or a body part to be examined (not shown) can be positioned within the substantially homogeneous region of the base magnetic field 7, e.g., provided on a patient bed 9.

Excitation of nuclear spins of certain atoms within the body can be provided via magnetic RF excitation pulses that are radiated using one or more RF antennas 13, such as a body coil. Other configurations of RF coils or antennas can also be provided in further embodiments, and such configurations may be adapted for particular portions of the subject anatomy to be imaged. The RF excitation pulses are generated by a pulse generation unit 15 that is controlled by a pulse sequence control unit 17. After an amplification by a radio-frequency amplifier 19, the RF pulses are relayed to the RF antenna 13. The exemplary RF system shown in FIG. 1 is a schematic illustration, and particular configurations of the various components may vary from that illustrated in exemplary embodiments of the disclosure. For example, the MR system 1 can include a plurality of pulse generation units 15, a plurality of RF amplifiers 19, and/or a plurality of RF antennas 13 that may have different configurations depending on the body parts being imaged.

The magnetic resonance system 1 further includes gradient coils 21 that can provide directionally and temporally varied magnetic gradient fields for selective excitation and spatial encoding of the RF signals that are emitted and/or received by the RF antenna(s) 13. The gradient coils 21 are typically oriented along the three primary axes (x- y- and z-directions), although other or additional orientations may be used in certain embodiments. Pulsed current supplied to the gradient coils 21 can be controlled by a gradient coil control unit 23 that, like the pulse generation unit 15, is connected with the pulse sequence control unit 27. By controlling the pulsed current supplied to the gradient coils 21, transient gradient magnetic fields in the x-, y-, and z-directions can be superimposed on the static base magnetic field B0. This makes it possible to set and vary, for example, the directions and magnitudes of a slice gradient magnetic field Gs, a phase encode gradient magnetic field Ge, and a read (frequency encode) gradient magnetic field Gr, which can be synchronized with emission and detection of RF pulses. Such interactions between RF pulses and transient magnetic fields can provide spatially selective excitation and spatial encoding of RF signals.

RF signals emitted by the excited nuclear spins can be detected by the RF antenna 13 and/or by local coils 25, amplified by associated radio-frequency preamplifiers 27, and processed further and digitized by an acquisition unit 29. In certain embodiments where a coil 13 (such as, for example, a body coil) can be operated both in transmission mode and in acquisition mode (e.g., it can be used to both emit RF excitation pulses and receive RF signals emitted by nuclear spins), the correct relaying of RF energy is regulated by an upstream transmission-reception diplexer 39.

An image processing unit 31 can generate one or more images based on the RF signals that represent image data. Such images can be presented to a user on one or more displays (e.g. monitors or screens) 33 and/or stored in a memory unit 35. A processor arrangement 37 can be provided in communication with various system components such as, e.g., the image processing unit 31, memory 35, pulse sequence control unit 17, one or more displays 33, etc., and configured to control and/or receive signals from various individual system components. For example, the processor arrangement 37 can be configured by programmed instructions to control certain components to generate particular sequences of RF pulses and magnetic field variations, digitize signals received from RF coils 25 to generate image data, generate images from such image data, and/or display images on monitor(s) 33. The processor arrangement 37 can also be provided with one or more conventional user interfaces, such as a mouse, a keyboard, a trackpad, and the like.

Figure 2:
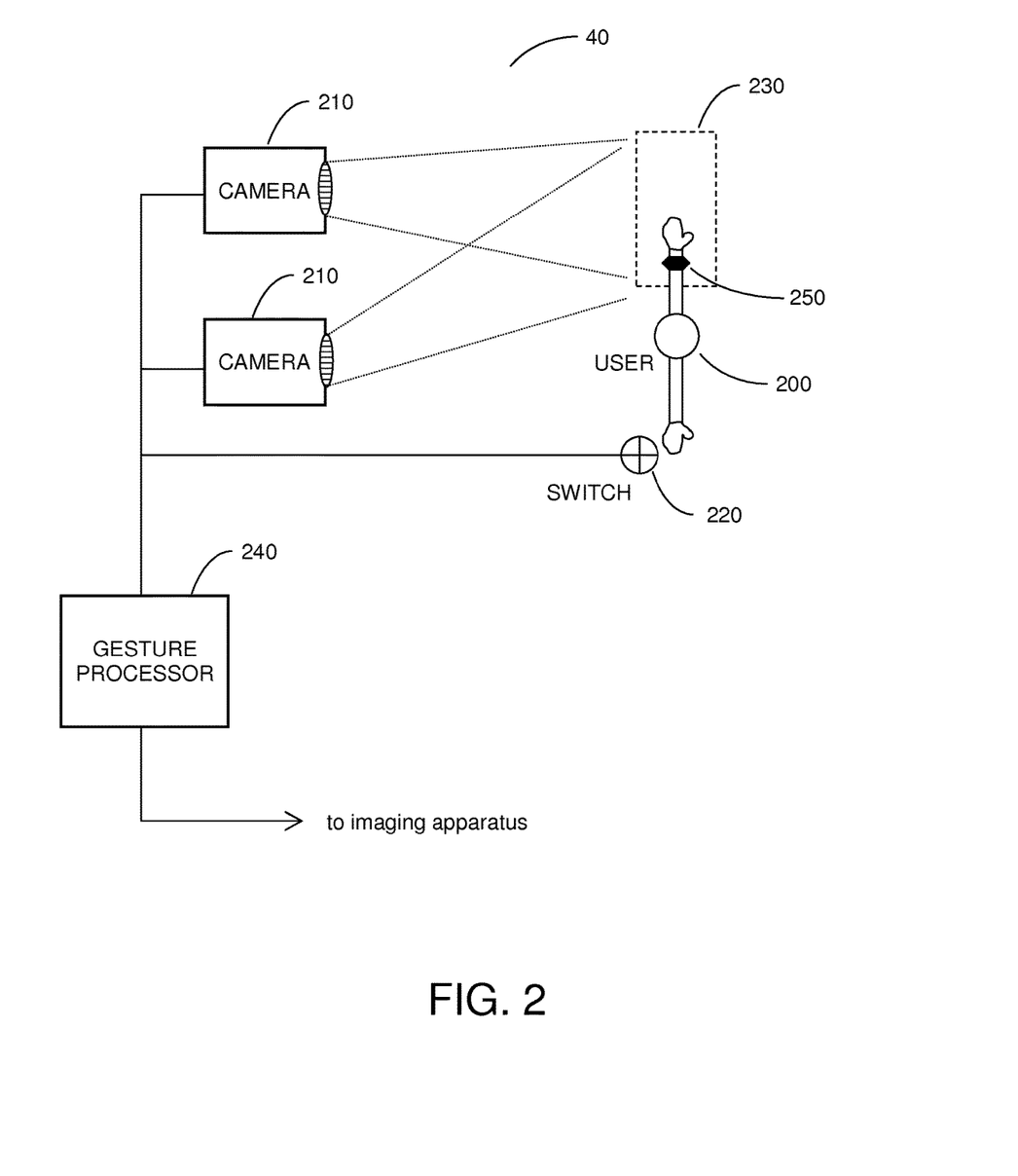
FIG. 2 is a schematic illustration of an exemplary gesture-based control system that can be used with the imaging system of FIG. 1.

The magnetic resonance system 1 can also include a gesture control unit 40, which can be provided in communication with the processor 37, the image processing unit 31, display 33, and/or other system components. A schematic illustration of an exemplary gesture control unit 40 in accordance with embodiments of the present disclosure is shown in FIG. 2. The gesture control unit 40 includes one or more cameras 210, which can include digital video cameras, infrared (IR) sensors, still-image cameras, or the like. Each camera 210 can be directed toward one or more motion capture regions 230. A motion capture regions 230 can be a volume of space proximal to a user 200. In certain embodiments, the camera(s) 210 can be configured and positioned such that a focal length of the camera(s) 210 corresponds approximately to a predetermined distance between the camera(s) 210 and the motion capture region(s) 230, e.g., to improve detection and imaging of objects within the motion capture region 230. In further embodiments, one or more cameras 210 can be directed toward the general area in which a user 200 may be located during the MRI-assisted procedure, e.g., to detect any movements within this general area.

The gesture control unit 40 can also include a gesture processor 240 provided in communication with the camera(s) 210. The gesture processor 240 can include, e.g., a computer processor, memory, a communications bus, instructions stored in computer-readable memory or other media, and the like; it can be configured to receive image data from the camera(s) 210 and interpret the image data, subject to certain conditions and/or restrictions described herein, to facilitate and/or provide identification of particular gestures or sequences thereof performed by a user 200. Examples of gesture recognition systems and techniques are described, e.g., in U.S. Pat. No. 8,745,541 to Wilson et al., which is incorporated herein by reference in its entirety. Other algorithms and techniques for using cameras 210 or the like, with associated computer processing arrangements, to detect gestures and facilitate gesture-based control of various electronic devices are known in the art. For example, the Microsoft Kinect system for the Xbox 360 and Xbox One videogame systems provides a gesture recognition system that facilitates control of on-screen commands and other functions while playing certain video games.

In certain embodiments, the image processing unit 31 and/or the processor arrangement 37 associated with the MRI system 1 shown in FIG. 1 can be configured to receive signals from the camera(s) 210 and to perform some or all of these gesture recognition functions. For example, the processor arrangement 37 and/or the image processing unit 31 can also perform some or all of the functions of the gesture processor 240 in some embodiments.

Certain MRI-assisted procedures may be conducted in a sterile environment. Accordingly, in certain embodiments, the camera(s) 210 can be provided outside of a sterile room containing components of the MRI apparatus such as the measurement chamber 3, a patient, a user 200, etc. Visual access (e.g. a field of view or lines of sight) between the camera 210 and the motion capture region 230 can be provided through a window provided in a wall of the room, or the like. In further embodiments, the camera(s) 210 can be provided in the same room as the MRI measurement chamber 3, patient platform 9, etc. The camera(s) 210 can be provided in wired or wireless communication with the gesture processor 240, the processor arrangement 37, and/or the image processing unit 31, which can also be provided in communication with other components of the imaging system 1 as shown in FIG. 1.

In further embodiments, the gesture control unit 40 can include one or more cameras 210 directed toward each of a plurality of motion capture regions 230. For example, an MRI-assisted procedure can be performed by a plurality of users 200 (e.g. an interventionist and an assistant). In such embodiments, each user 200 may be positioned or located in a particular location relative to the patient bed 9. Alternatively, a single user 200 may be positioned at more than one location during a procedure. One or more motion capture regions 230 can be associated with each user 200 and/or with each user location, and the camera(s) 210 can be positioned and configured to detect motions or gestures within each of the plurality of motion capture regions 230.

In certain embodiments, the gesture control unit 40 can include an emitter 250. The emitter 250 can be configured to emit certain signals such as, e.g., infrared light or light having another particular wavelength or range(s) of wavelengths. The emitter 250 can include one or more LEDs and/or other emitting elements. At least one camera 210 can be configured to detect signals from the emitter 250. For example, the emitter 250 can include one or more LEDs that emit light in the infrared region, and the camera 210 can be configured to be sensitive to such infrared radiation. The optional use of such emitters 250 can improve accuracy of motion detection for identifying gestures used to control aspects of the imaging system 1. Other types of emitting elements and cameras 210 can also be used in further embodiments.

The emitter 250 can be provided, e.g., as a bracelet around a wrist of the user 200, as shown in FIG. 2. In further embodiments, the emitter 250 can be attached to a surgical glove (e.g. on the back of a hand), attached to a sleeve or other clothing item of the user 200, provided on a headband to be worn by the user 200, or the like. The emitter 250 can be battery powered to provide restriction-free motion, or it can optionally be wired to a power source. The emitter 250 can include a plurality of emitting elements such as LEDs or the like, which can be spatially distributed to provide detectable signals that are insensitive to a particular orientation of the emitter 250. In certain embodiments, two or more emitters 250 can be provided for a single user 200. In still further embodiments, one or more emitters 250 can be provided for each of two or more users 200.

In another embodiment, one or more light-reflective markers or objects (not shown) can be affixed to a user in place of or in addition to the emitter 250, and one or more light sources (e.g. an infrared source) can be provided (e.g., near the one or more cameras) and directed toward the user 200. The camera 210 can be provided to detect the emitted light that is reflected from the reflective markers and thereby detect motion of the marker caused by movement of the user 200.

The gesture control unit 40 also includes one or more verification switches 220 that can be provided proximal to the location of a user 220 during operation of the imaging system 1. The verification switch 220 can be provided in one or more configurations. For example, the verification switch 220 can be an electrical switch, a pneumatic switch, or the like. In one embodiment, the verification switch 220 can be a foot-operated switch, which can be placed on the floor proximal to the user or attached to a chair leg or support. In another embodiment, the verification switch 220 can be an inductive switch, e.g., a switch that can detect if a body part touches it or is located very close to it, and provide a signal based on such detection. In a still further embodiment, the verification switch 220 can be a switch mounted to a tabletop or work surface, which may be activated by pressing it with an elbow, a forearm, or the like.

The verification switch(es) 220 can also be provided in communication with other components of the imaging system 1, e.g., and configured to provide a signal to the computer 37, the image processing unit 31, and/or to other components of the MRI system 1 shown in FIG. 1 when activated by the user 200. The verification switch 220 can be used to improve safety and accuracy when using gestures to control certain aspects of the MRI system 1, as described herein.

Other locations and mounting configurations for the verification switch 220 can also be provided in further embodiments. For example, the verification switch 220 can also be provided as a small switch affixed to the user's hand (e.g., a hand not holding a medical instrument) such that it can be activated by making a fist, pressing the thumb to a fingertip or the side of the index finger, etc. Other types and configurations of the verification switch 220 having such features (e.g. not restricting hand motion when activated, able to communicate a signal to other components of the imaging system 1, etc.) can also be provided in further embodiments of the disclosure.

In an MRI-assisted procedure, the exemplary system 1 shown in FIG. 1 can be configured to detect particular gestures made by a user 200 using gesture control unit 40, and to use such gestures to enact certain commands that can control aspects of the MRI system 1. For example, particular gestures can be detected, interpreted, and/or recognized by gesture control unit 40, and used to control various aspects of the imaging system 1, including but not limited to: changing or setting parameters of an imaging sequence, initiating an MR image acquisition sequence, moving the patient bed 9, displaying or updating a particular MR image on the display 33, etc. Imaging parameters that can be controlled include, e.g., adjusting or changing the image plane for an imaging sequence, changing certain RF pulse and/or magnetic field gradient parameters associated with the imaging sequence, stopping an imaging sequence, etc.

The exemplary system 1 can also be configured to control the display of one or more MR images on the screen(s) 33 using gesture commands. For example, gestures can be used to send instructions to the image processing unit 31 and/or processor 37 to display certain images, scroll between images, move images on the screen, change magnification of a displayed image, etc. Such control of certain aspects of the imaging system 1 can be performed by a user 200 without requiring physical manipulation of a keyboard, mouse, stylus, or other physical interface device.

The gesture control unit 40 can be configured to provide safety controls and/or confirmation or limitation of gesture commands. For example, the verification switch 220 can be configured to activate or enable gesture detection, gesture recognition, and/or gesture control of certain features of the system 1 only when the verification switch 220 is activated. In such embodiments, various movements of the user 200 during a procedure will not result in control commands being provided by the gesture control unit 40 absent a specific activation of the verification switch 220 by the user 200. For example, motions made by a user 200 during an MRI-assisted procedure such as gesturing to an assistant or manipulating certain medical instruments will not be recognized as control gestures and will not result in associated commands being sent to the MR imaging system 1 unless the verification switch 220 is purposely activated by the user 200.

In certain embodiments, the gesture control unit 40 can be configured to detect and/or recognize a gesture command only while the verification switch 220 is activated, or within a short time interval after such switch activation. This embodiment provides a degree of control by the user 200 of when the MRI system 1 will detect, interpret, and execute a gesture command. In this manner, motions of body parts that the user 200 may make during a procedure will not be erroneously identified as gesture commands, and only gestures performed during or immediately subsequent to activation of the verification switch 220 will be detected and acted upon by the system 1.

Figure 3:
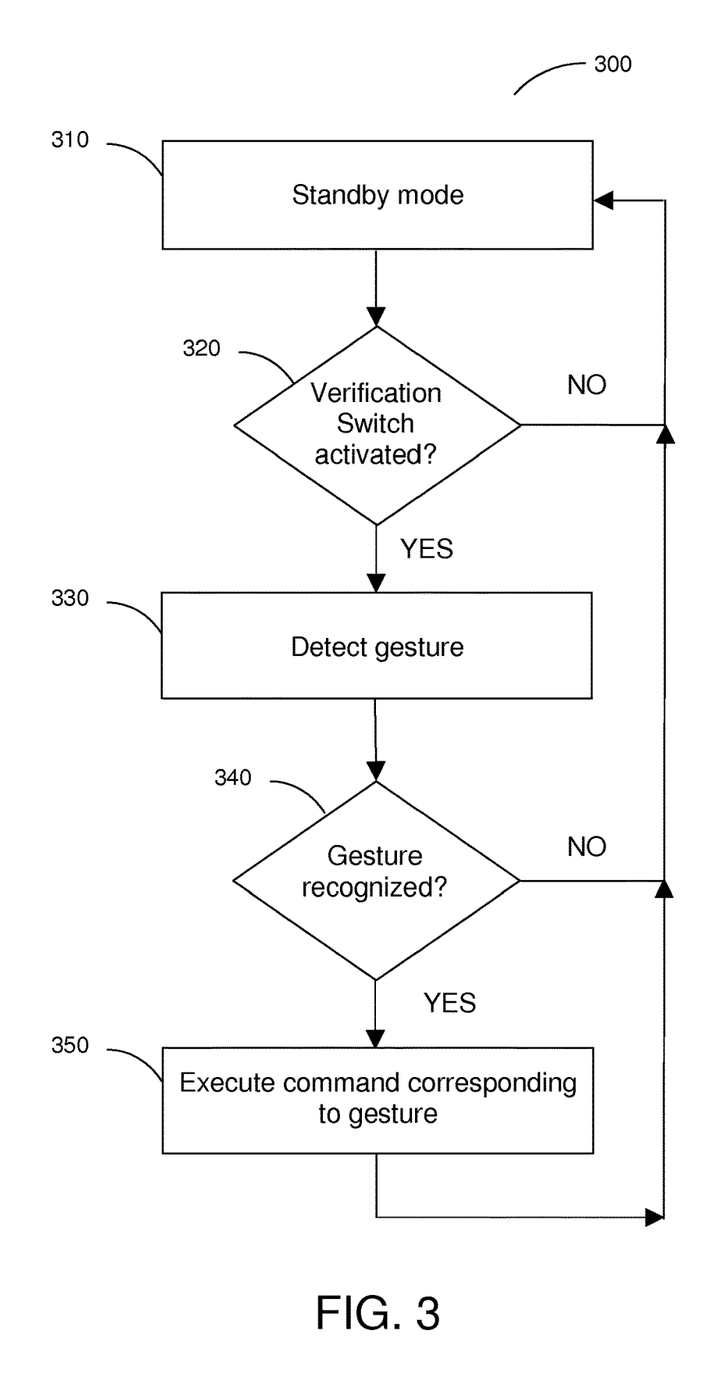
FIG. 3 is a flowchart of an exemplary method and control configuration for gesture-based control of an imaging system in accordance with embodiments of the present disclosure.

A flowchart for this exemplary system configuration and method is shown in FIG. 3. For example, the gesture control unit 40 can be configured to be in a "standby" mode (step 310) in which the camera(s) 210 is/are not activated and/or video signals provided by the camera(s) 210 are ignored or not processed by the gesture processor 240. The gesture control unit 40 can be configured to monitor for activation of the verification switch 220 (step 320). The camera 210 and/or gesture processor 240 can be activated (step 330) to detect motion by a user 200 while the verification switch 220 is in an activated state, and the gesture processor 240 can be configured to then recognize and/or interpret such gesture (step 340). A control or command can then be provided to other components of the MRI system 1 based on such recognized gesture to the MRI system 1 (step 350) as described herein. After the gesture command is provided or executed, the gesture control unit 40 can return to a standby mode (step 310) until the verification switch 220 is activated again (step 320). For example, maintaining the gesture control unit 40 in an inactive "standby" state (step 310) unless/until the verification switch 220 is activated can reduce or eliminate RF interference or other associated types of interference that may affect the image acquisition if the gesture control unit 40 were active during an imaging sequence.

In one embodiment, the gesture control unit 40 can be configured to detect an activation of the verification switch 220, and the camera(s) 210 and gesture processor 240 configured to obtain and process visual input (e.g., a gesture) within the camera's field of view, only within a particular time interval following activation of the verification switch 220. Such time interval for detection of a gesture can be relatively short, e.g., within 30 seconds of activation of the verification switch 220, or within about 15 seconds of such activation. This time interval can be preferably long enough to allow for initiation and completion of one or more gestures by the user 200, while also being short enough to avoid detection and misinterpretation of other motions of the user 200 as gesture commands, when such other motions are not intended to be gesture commands. The method and system control configuration 300 shown in FIG. 3 can also illustrate this embodiment, where the camera 210 and/or gesture processor 240 are activated (step 330) for a particular time interval following a detected (and optionally momentary) switch activation. In this embodiment, gestures can be detected for a short time after activation of the verification switch 220 (in step 330), rather than being detected only while the verification switch 220 is activated. This embodiment can be more convenient for a user 200 in certain instances, e.g., where the verification switch 220 is activated by a hand or other body part that is also used to perform the gesture.

In a typical MRI-assisted procedure, one or more monitors 33 can be provided proximal to or within clear view of a user 200. Such monitor(s) 33 can be configured to display images generated by the MR imaging system 1 before, during, and/or after an MRI-assisted procedure. For example, the monitor 33 can display one or more MR-based images of a region of the patient's anatomy to provide accurate placement of a needle, catheter, or other medical instrument or device within a patient.

In certain embodiments of the present disclosure, the monitor 33 can also be used to further improve the accuracy and/or reliability of the gesture-based control system described herein. For example, upon detection and recognition of a gesture command, the command can be displayed on the monitor 33. For example, the command can be displayed on an edge portion of the monitor 33, or in another part of the visible screen that is not being used to show other images. The command corresponding to the recognized gesture can be displayed as, e.g., a text label, a graphic icon or symbol, or a combination of both text and images.

If the displayed command is the one intended by the user 200, then the verification switch 220 can be activated to confirm the command such that the system 1 will then execute the verified command. If the command is not verified within a particular time interval, the gesture can be considered not to be accepted and the image showing the command can optionally be removed from the monitor 33. Such time interval for verification of a displayed gesture command can be relatively short, e.g., within 30 seconds of when the recognized gesture is displayed on the monitor 33 as a command, or within about 15 seconds of such displaying. This time interval can be preferably long enough to allow for verification of a command by the user 200 using the verification switch 220.

In certain embodiments, the gesture control unit 40 can be configured to detect and recognize a subsequent gesture, and display a command associated with the subsequent gesture on the monitor 33 if the previously-displayed command is not verified by the user 200. In this embodiment, the user 200 can "re-do" a gesture command if the displayed command is not the intended one. Execution of the displayed command only when the verification switch 220 is activated can reduce the likelihood that a command will be executed in error.

Figure 4:
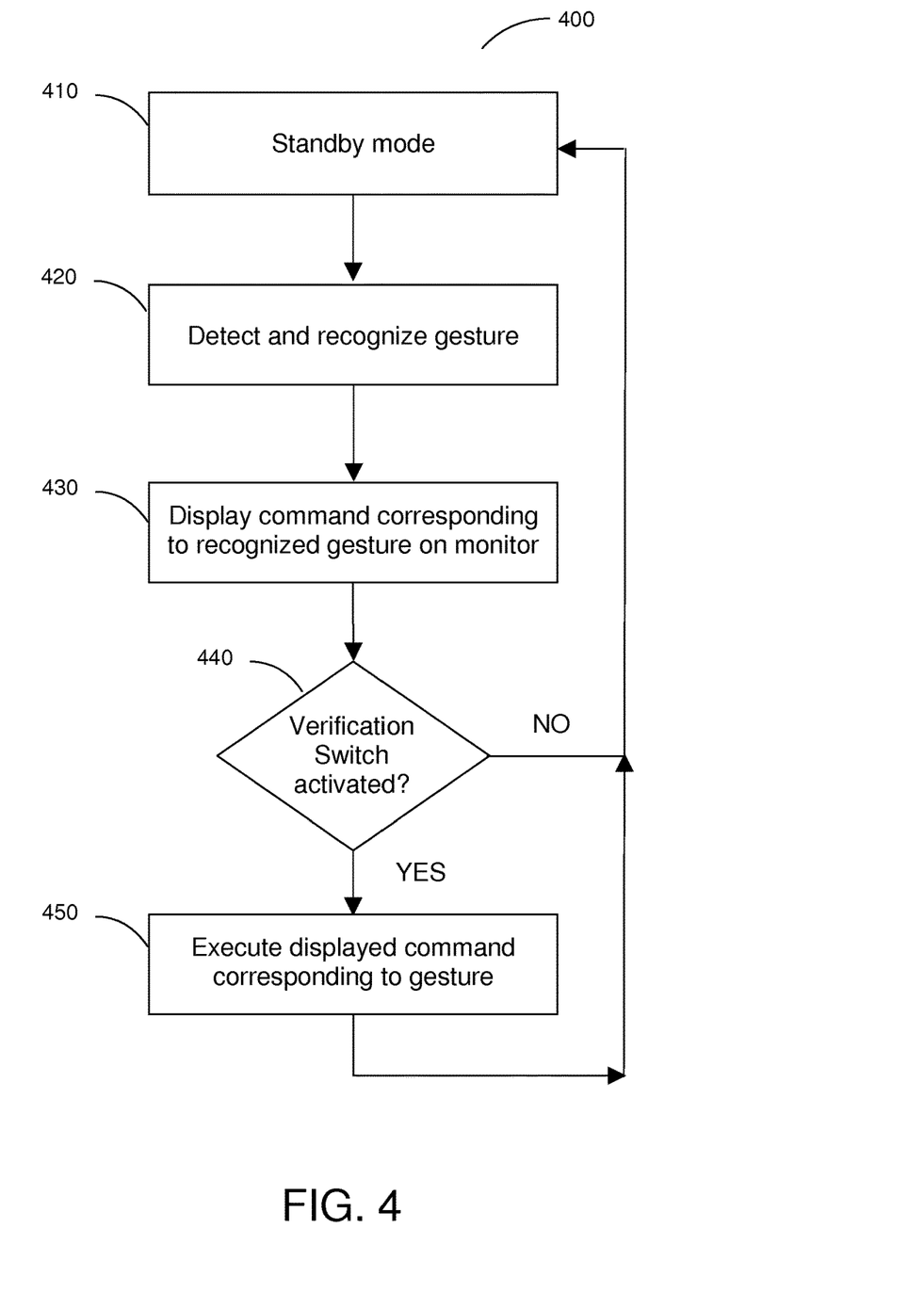
FIG. 4 is a flowchart of a further exemplary method and control configuration for gesture-based control of an imaging system.

An exemplary method and system configuration 400 for providing such verification of gesture commands is shown in FIG. 4. For example, the gesture control unit 40 can be configured to be in a "standby" mode (step 410). A gesture can be detected and recognized in step 220, as described herein. The command corresponding to the recognized gesture can then be displayed on the monitor 33 (step 430). The gesture control unit 40 can be configured to execute the displayed command (step 450) only if/when the verification switch 220 is activated (step 440). If the verification switch 220 is not activated, the system can return to a standby mode (step 410) in which it will continue to detect any gestures performed by the user 200, e.g., within the motion capture region(s) 230.

In further embodiments, certain features of the system configurations and methods described herein can be combined. For example, the system 1 can be configured to detect and/or interpret a gesture only when the verification switch 220 is activated (or shortly thereafter). A command corresponding to such a recognized gesture can then be displayed on the monitor 33, and the system 1 can be configured to execute the displayed command only after it is verified by activation of the verification switch 220.

In a further embodiment, a plurality of verification switches 220 can be provided. For example, different verification switches 220 can be provided for use/activation by two or more users 200. Alternatively, different verification switches 220 can be activated by a single user, e.g., a first verification switch 220 can be provided to "activate" the gesture control unit to detect and interpret a gesture, and a second verification switch 220 can be provided to execute a command corresponding to the gesture when the command is displayed on the monitor 33 as described herein.

In further embodiments, the imaging system 1 can be configured to ignore certain control activities, such as activation of the verification switch 220, gestures performed by a user 200, keyboard input, etc. for particular time intervals. Such time intervals can correspond to, e.g., time intervals during which the patient bed 9 is being (re)positioned, an instrument such as a needle, probe, or other instrument or device is being placed or positioned on or within a patient, the imaging system is not in a state suitable for receiving commands (e.g. during a diagnostic or warmup sequence), etc. In such embodiments, the imaging system 1 can be configured to perform a check on the status of the system to verify whether a gesture or other control command should be executed. This check can be performed, e.g., between steps 340 and 350 in the exemplary method/configuration shown in FIG. 3, or between steps 440 and 450 in the exemplary method/configuration shown in FIG. 4.

The foregoing merely illustrates the principles of the present disclosure. Various modifications and alterations to the described embodiments will be apparent to those skilled in the art in view of the teachings herein. It will thus be appreciated that those skilled in the art will be able to devise numerous techniques which, although not explicitly described herein, embody the principles of the present disclosure and are thus within the spirit and scope of the present disclosure. All patents and publications cited herein are incorporated herein by reference in their entireties.

What is claimed is:

1. An MR imaging system that provides improved user control of certain system functions, comprising:
    an MR imaging arrangement configured to generate magnetic fields, generate RF pulse sequences, detect RF signals, and generate images based on such detected RF signals; and
    a gesture-based control arrangement comprising at least one camera and a switch,
    wherein the gesture-based control arrangement is configured to detect at least one gesture performed by a user, and to execute at least one predetermined command based on recognition of the at least one gesture, and
    wherein at least one of the detection of the at least one gesture and the execution of the at least one command is based on an activation of the switch, wherein the switch is at least one of a mechanical switch, a pneumatic switch, or an electrical switch.

2. The MR imaging system of claim 1, wherein the gesture-based control arrangement comprises a plurality of cameras.

3. The MR imaging system of claim 1, wherein the switch is an inductive switch.

4. The MR imaging system of claim 1, further comprising at least one emitter of electromagnetic energy that is configured to be affixed to the user, wherein the at least one camera is configured to detect the electromagnetic energy to facilitate the detection of the at least one gesture.

5. The MR imaging system of claim 4, wherein the electromagnetic energy comprises at least one of infrared light or near-infrared light.

6. The MR imaging system of claim 1, further comprising:
    at least one emitter of electromagnetic energy configured to direct electromagnetic energy toward the user, and
    at least one reflective arrangement configured to be affixed to the user,
    wherein the at least one camera is configured to detect the electromagnetic energy after it is reflected from the at least one reflective arrangement to facilitate the detection of the at least one gesture.

7. The MR imaging system of claim 6, wherein the electromagnetic energy comprises at least one of infrared light or near-infrared light.

8. The MR imaging system of claim 1, wherein the at least one switch is configured to activate the at least one camera to detect the at least one gesture within a particular time interval following the activation of the switch.

9. The MR imaging system of claim 1, wherein the MR imaging system is configured to execute the at least one predetermined command based on the recognition of the at least one gesture only after the switch is activated.

10. The MR imaging system of claim 1, further comprising at least one display arrangement that is configured to display the at least one predetermined command based on the recognition of the at least one gesture, wherein the system is configured to execute the displayed command when the switch is activated.

11. The MR imaging system of claim 1, wherein the at least one predetermined command comprises at least one of starting an imaging sequence, terminating an imaging sequence, changing a parameter associated with an imaging sequence, and changing an image displayed on a display arrangement.

12. A method for controlling an MR imaging system using gestures, comprising:
    providing a gesture-based control arrangement in communication with the MR imaging system, wherein the gesture-based control arrangement comprises at least one camera and a switch,
    configuring the gesture-based control arrangement to detect at least one gesture performed by a user, and to execute at least one predetermined command based on recognition of the at least one gesture,
    wherein the execution of the at least one command is based on an activation of the switch, wherein the switch is at least one of a mechanical switch, a pneumatic switch, or an electrical switch.

13. The method of claim 12, further comprising providing at least one emitter of electromagnetic energy that is configured to be affixed to the user, wherein the at least one camera is configured to detect the electromagnetic energy to facilitate the detection of the at least one gesture.

14. The method of claim 13, wherein the electromagnetic energy comprises at least one of infrared light or near-infrared light.

15. The method of claim 12, further comprising:
    directing electromagnetic energy toward the user, and
    providing at least one reflective arrangement configured to be affixed to the user,
    wherein the at least one camera is configured to detect the electromagnetic energy after it is reflected from the at least one reflective arrangement to facilitate the detection of the at least one gesture.

16. The method of claim 15, wherein the electromagnetic energy comprises at least one of infrared light or near-infrared light.

17. The method of claim 12, wherein the at least one switch is configured to activate the at least one camera to detect the at least one gesture within a particular time interval following the activation of the switch.

18. The method of claim 12, wherein the MR imaging system is configured to execute the at least one predetermined command based on the recognition of the at least one gesture only after the switch is activated.

19. The method of claim 12, further comprising providing at least one display arrangement that is configured to display the at least one predetermined command based on the recognition of the at least one gesture, wherein the system is configured to execute the displayed command when the switch is activated.

20. The MR imaging system of claim 1, wherein the at least one predetermined command comprises at least one of starting an imaging sequence, terminating an imaging sequence, changing a parameter associated with an imaging sequence, and changing an image displayed on a display arrangement.

* * * * *

UNITED STATES PATENT AND TRADEMARK OFFICE
CERTIFICATE OF CORRECTION

PATENT NO. : 10,180,469 B2
APPLICATION NO. : 14/924843
DATED : January 15, 2019
INVENTOR(S) : Arne Hengerer et al.

It is certified that error appears in the above-identified patent and that said Letters Patent is hereby corrected as shown below:

In the Specification

In Column 1, Line 4 insert the following language:
--STATEMENT REGARDING FEDERALLY SPONSORED RESEARCH OR DEVELOPMENT
This invention was made with government support under EB007829 awarded by the National Institutes of Health. The government has certain rights in the invention.--

Signed and Sealed this
Ninth Day of June, 2020

Andrei Iancu
*Director of the United States Patent and Trademark Office*